United States Patent [19]
Bacon et al.

[11] Patent Number: 5,379,176
[45] Date of Patent: Jan. 3, 1995

[54] PROTECTIVE INPUT CIRCUIT FOR AN INSTRUMENT

[75] Inventors: Glade B. Bacon, Everett; Heber P. Farnsworth, Snohomish, both of Wash.

[73] Assignee: John Fluke Mfg. Co., Inc., Everett, Wash.

[21] Appl. No.: 57,698

[22] Filed: May 3, 1993

[51] Int. Cl.⁶ .............................................. H02H 5/04
[52] U.S. Cl. .................................... 361/106; 361/56; 361/108; 361/111
[58] Field of Search ............. 361/106, 108, 119, 124, 361/126, 56, 57, 54, 111

[56] References Cited

U.S. PATENT DOCUMENTS

| | | |
|---|---|---|
| 4,068,281 | 1/1978 | Harnden, Jr. ................... 361/106 |
| 4,583,146 | 4/1986 | Howell ............................. 361/13 |
| 4,967,176 | 10/1990 | Horsma et al. ................. 338/22 R |
| 5,250,893 | 10/1993 | Gambill et al. ................. 324/990 |

*Primary Examiner*—A. D. Pellinen
*Assistant Examiner*—Sally C. Medley
*Attorney, Agent, or Firm*—Dellett and Walters

[57] ABSTRACT

A protective circuit for the input of a multimeter is provided with series connected thermistors partially shunted by a varistor whereby overload voltage is distributed between the thermistors enabling protection at higher voltage levels. Shunt connected varistors protect primarily against transient overloads and are thermally coupled to the aforementioned thermistors to bring the thermistors more rapidly to their high resistance condition such that damage to the varistors is avoided and continued protection is provided.

15 Claims, 2 Drawing Sheets

PROTECTIVE INPUT CIRCUIT FOR AN INSTRUMENT

BACKGROUND OF THE INVENTION

The present invention relates to a protective circuit for the input of a multimeter or similar instrument, and particularly to a circuit for protecting against higher than normal input voltages.

Protective circuits are suitably employed at the input of sensitive instruments to protect against voltages higher than normal operating voltages. One arrangement for providing this kind of protection comprises means in series with the instrument such as a fuse or thermistor, and a parallel protection component such as a spark gap, zener diode or varistor.

The combination of a series PTC (positive temperature coefficient) thermistor and a parallel MOV (metal oxide varistor) has proved particularly advantageous. The thermistor is characterized by low input impedance during normal operation but develops very high impedance when heated in response to excessive current. The shunt connected varistor causes transient overvoltages to bypass the protected circuit. Metal oxide varistors are faster than spark gaps and handle much higher energy than zener diodes, and when overloaded the metal oxide varistors fail in a shorted condition therefore continuing to provide circuit protection. In most cases the thermistor and varistor circuitry can recover spontaneously upon removal of the overload.

However, the above described circuit is limited not only in regard to the degree of steady state overvoltage protection but also with respect to transients. The series PTC thermistor is typically adapted to withstand voltages in the vicinity of 600 volts with complete recovery. However, it would be desirable for an instrument to withstand inadvertent application of higher voltages.

The shunt varistor is the first line of protection against transients but can be particularly susceptible to repetitive transients having peak amplitudes exceeding the varistor knee voltage although the rms values may not exceed the instrument's voltage rating. The varistor operates very rapidly upon the presentation of a high voltage transient and will conduct before the series connected thermistor senses an overload. Dissipation in the shunt connected varistor subjected to repeated transients can be many times the dissipation in the series thermistor, and unless the varistor is considerably oversized it can become permanently damaged.

SUMMARY OF THE INVENTION

In accordance with the present invention, a protective circuit for an instrument such as a multimeter comprises a series protective path and a parallel or shunt connected path. The series connected path includes plural thermistor means with a varistor disposed across at least one thermistor means whereby even distribution of relatively high steady state voltages can be accomplished. The parallel path comprises a shunt connected varistor disposed in heat conducting relation to an aforementioned thermistor means so that heat from the varistor causes the thermistor means to transition to a high resistance state whereby the varistor is protected under transient conditions.

It is accordingly an object of the present invention to provide an improved protective circuit for an instrument for protecting against both steady state high voltages and high voltage transients.

It is another object of the present invention to provide an improved protective circuit including series connected thermistor means and parallel connected varistor means, which circuit is fully recoverable to provide continued protection.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 1:
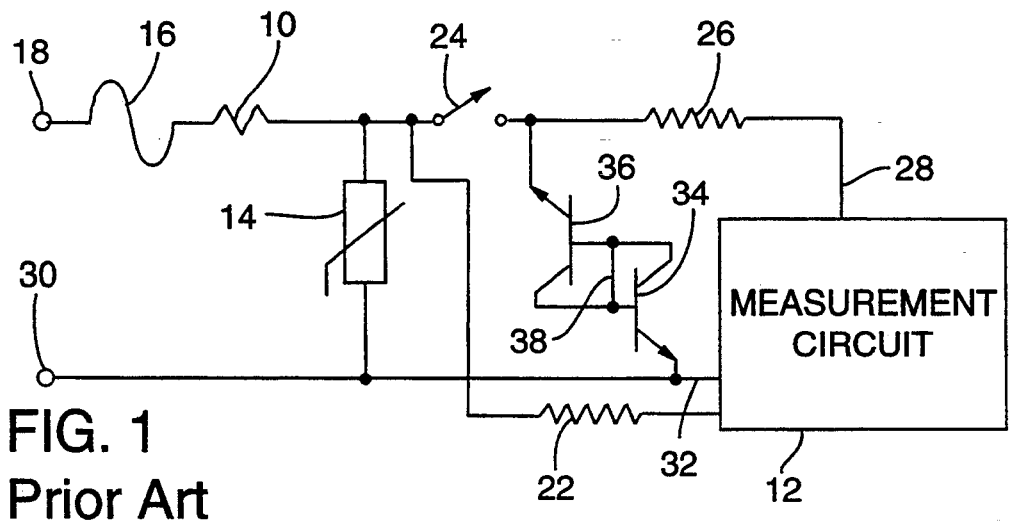
FIG. 1 is a schematic diagram of a typical prior art instrument protection circuit.

FIG. 1 illustrates a prior art protective circuit for a measuring instrument such as a digital multimeter adapted for making "volts" and "ohms" measurements, said protective circuit including a PTC (positive temperature coefficient) thermistor 10 in series relationship with measurement circuit 12, and an MOV (metal oxide varistor) 14 disposed in shunt relation with the measurement circuit. Thermistor 10 is coupled at one terminal thereof through fusible resistor 16 to a first terminal or probe 18, while the remaining terminal of thermistor 10 is coupled to the voltage measurement input 20 of circuit 12 by way of resistor 22 having a fairly high resistance such as ten megohms. The second terminal of the thermistor is further connected through switch 24 and low resistance reference resistor 26 in series to a second terminal 28 of circuit 12 adapted for sourcing current used in ohms measurements. In this circuit, switch 24 will be closed for ohms measurement and open for voltage measurement. The remaining terminal or probe 30 is connected to the common terminal 32 of the measurement circuit, while varistor 14 shunts the second terminal of thermistor 10 to common terminal 32. A pair of transistors 34 and 36 having their bases and collectors joined by lead 38 behave as protective zener diodes. The emitter of transistor 34 is connected to common terminal 32 and the emitter of transistor 36 connects to the junction between switch 24 and reference resistor 26.

In the FIG. 1 circuit, thermistor 10 is adapted to heat and transition to its high resistance condition in response to current therethrough when a high voltage, e.g. of constant magnitude, is unintentionally applied between terminals 18 and 30 with switch 24 closed. Available thermistors typically have a rating of no higher than about 660 volts. Varistor 14 is the first line of defense against higher voltage transients and will conduct across the measurement circuit when its knee voltage is exceeded. Varistor 14 limits the voltage across an open switch 24 when a comparatively large amplitude voltage transient is applied across terminals 18 and 30. An arc across switch 24 occurring under such circumstances can result in instrument damage because of high frequency energy.

The FIG. 1 circuit has inherent limitations so far as being able to withstand higher voltage levels. It would be desirable if the meter could fully recover if a voltage of 1000 volts ac/dc or higher were applied to its inputs with switch 24 closed or if high voltage transients of many kilovolts were received, particularly in the case of repetitive transients applied across the input terminals having peak amplitudes exceeding the knee voltage of varistor 14 but rms values not exceeding the instrument's voltage rating. In the circuit of FIG. 1, thermistor 10 is ineffective and will fail at 1000 volt rms levels even if made physically larger, and a repetitive transient will tend to overheat varistor 14 often resulting in its destruction.

The problem associated with thermistor 10 can be solved by the substitution of an extended operating range thermistor device as disclosed in co-pending application Ser. No. 08/057,170, filed May 3, 1993, which is assigned to the assignee of the present invention, wherein plural thermistors in series are each shunted with individual varistors. Such a circuit avoids thermistor destruction at higher steady state voltages by forcing a uniform voltage distribution across plural thermistors, therefore enabling a higher voltage rating. This solution is an advantageous one; however, in the particular circuit of FIG. 1 the transient problem associated with varistor 14 is thereby aggravated inasmuch as the aforementioned extended operating range thermistor essentially shorts out at high (e.g. transient) voltages and excessive dissipation takes place in the varistor.

Figure 2:
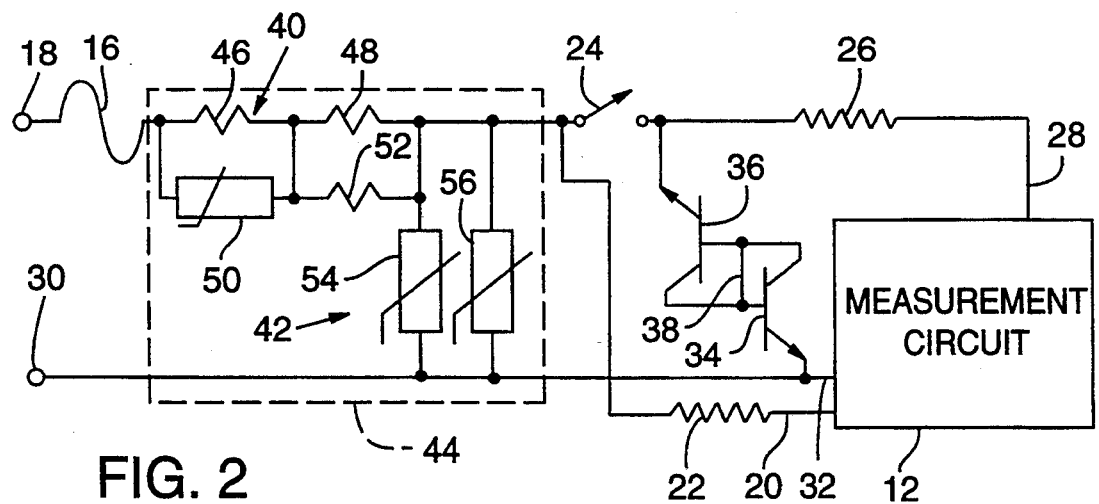
FIG. 2 is a schematic diagram of an instrument input protection circuit according to the present invention.

In accordance with the present invention, as illustrated in FIG. 2, thermistor 10 and varistor 14 of FIG. 1 are replaced by an extended range thermistor circuit 40 and a varistor circuit 47 in thermally conductive relation with one another as indicated by dashed lines 44. As hereinafter more fully described, the units are preferably joined in thermally conductive relation so that when the knee voltage of varistor means 42 is exceeded, heat is immediately conveyed to extended range thermistor 40 whereby the latter will drop sufficient voltage to protect the varistor, for example when repetitive voltage transients occur.

Figure 5:
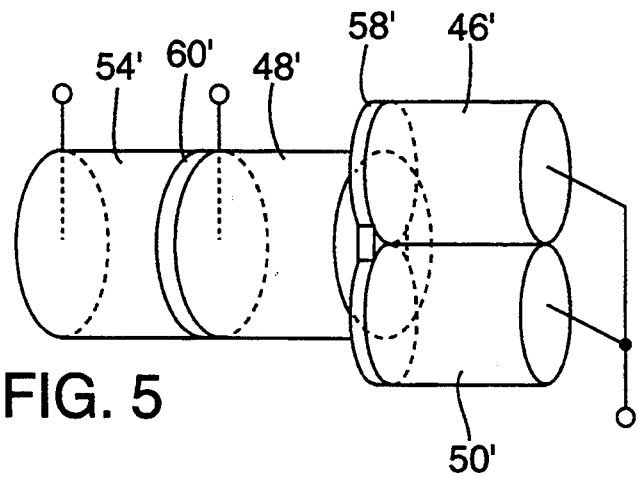
FIG. 5 is a perspective view of an alternative physical realization of the FIG. 3 device.

Extended range thermistor 40 comprises first and second PTC thermistors 46 and 48 disposed in series between resistor 16 and switch 24. Thermistor 46 is shunted by MOV varistor 50 while thermistor 48 is shunted by another PTC thermistor 52 of similar type. Thermistors 46, 48 and 52 in this circuit suitably have the same nominal size and resistivity. Alternatively, thermistors 48 and 52 can be replaced by one thermistor having twice the current carrying capacity and half the cold resistance of thermistor 46 for example a thermistor of greater relative cross section as shown in FIG. 5.

The circuit comprising elements 46, 48, 50 and 52 provides an extended range thermistor means very suitable for the present purposes inasmuch as it does not have the above-described disadvantage associated with an extended range thermistor comprising plural, serially connected thermistors with each one shunted by a varistor. In the present circuit, thermistors 48 and 52 prevent varistor clamping action and therefore can protect shunt varistors 42 as well as fusible resistor 16 under high voltage transient conditions.

In the above described circuit, thermistor 46 has a higher cold resistance than the parallel combination of thermistors 48 and 52 or equivalent, and therefore thermistor 46 invariably heats and transitions to its high resistance state first. As the voltage across thermistor 46 reaches the knee voltage Vn of varistor 50, varistor 50 conducts and prevents damage to thermistor 46 until thermistors 48 and 52 heat sufficiently so they also transition to their high resistance state. Voltage is then proportionately divided across thermistors 46 and 48 at a higher level, as necessary, than could be withstood by the single thermistor 10 described in connection with FIG. 1. The circuit is capable of withstanding voltages on the order of 1100 volts ac/dc as applied across terminals 18 and 30 with switch 24 closed, with full recovery. The extended range thermistor can include additional paralleled thermistor varistor sections then connected in series with one another to withstand higher voltages, so long as at least one section comprises only thermistor means.

The shunt varistor circuit 42 suitably comprises varistors 54 and 56 in parallel and protects the ensuing circuitry against high voltage transients. However, varistors 54 and 56 are disposed in heat conductive relation to thermistors 48, 52 and 46 and therefore a repetitive voltage transient applied to terminals 18 and 30 will not result in destruction of varistors 54 and 56. Despite the high heat dissipated in 54 and 56 under these circumstances, the heat is immediately conducted to thermistors 48 and 52 causing the latter to assume a high resistance state. Consequently, substantial voltage will be dropped across the thermistor circuitry. It may be noted that transients in themselves may be of too short a duration to otherwise cause extended range thermistor means 40 to transition to a high resistance state.

It will be noted varistors 54 and 56 are protected in two ways: (1) the extended range thermistor and varistor means 40 does not clamp out, and (2) heat from 54 and 56 is conducted to the thermistor means 40 so that means 40 immediately develops high resistance.

Figure 3:
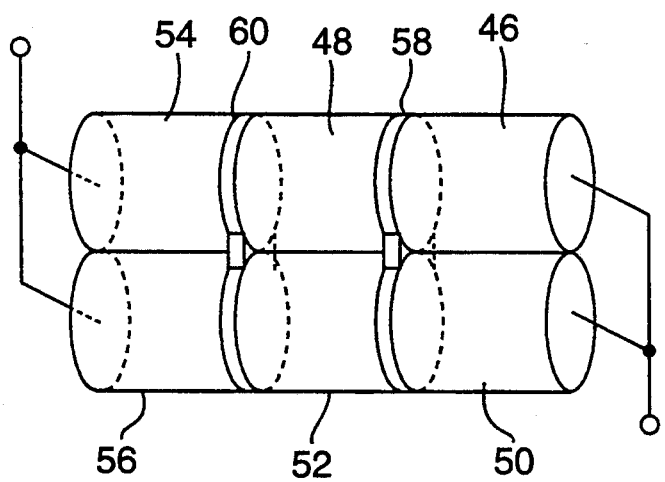
FIG. 3 is a perspective view of an advantageous physical realization of the protective portion of the FIG. 2 circuit.

An advantageous physical construction in accordance with the present invention is illustrated in FIG. 3 wherein the portion of the circuit enclosed by dashed lines 44 of the FIG. 2 circuit is embodied. Each of the thermistors and varistors is formed of bulk material and provided from readily available commercial sources as equal-sized, solid cylindrical slugs. The elements are disposed in thermally conductive, contacting relation in two adjoining columns oriented horizontally as depicted in FIG. 3, each column comprising three elements in end-to-end relationship, such heat conductive relationship being as indicated by dashed lines 44 in FIG. 2. The elements are joined by sheet metal spacers 58 and 60 soldered between the metalized ends of the individual thermistor and varistor slugs. The solder may comprise a heat setting, metal filled epoxy resin.

Each spacer 58, 60 bridges between the columns to complete the series and parallel connections in FIG. 2 as well as to provide heat conduction. It will be noted that thermistors 48 and 52 adjoin 54 and 56 in end-toend relation for optimizing heat transfer and the transitioning of thermistors 48 and 52 when varistors 54 and 56 dissipate large amounts of energy.

Figure 4:
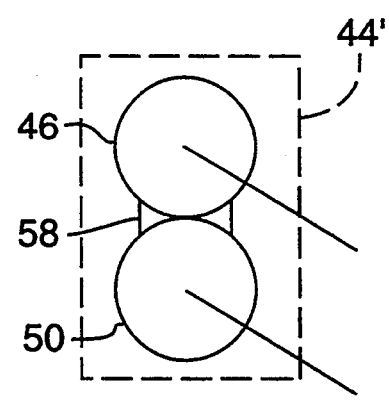
FIG. 4 is an end view of the device as depicted in FIG. 3.

Spacer elements similar to elements 58 and 60 can be secured to thermistor 46 and varistor 50 at one end of the structure, as well as to varistors 54 and 56 at the other end of the structure, for securing the combination in heat conductive relation. The device comprising means 40 and 42 of FIG. 2 is advantageously encapsulated in heat conducting but electrically insulating material indicated by dashed lines 44' in the end view of FIG. 4. The encapsulation in its simplest form merely comprises a common insulating container, enclosure or package.

An alternative construction is illustrated in FIG. 5 wherein elements 46', 48', 50', 54', 58' and 60' correspond to similarly numbered elements in FIG. 3. However, paralleled thermistors 48 and 42 are replaced by a larger cylindrical slug thermistor 48' having similar characteristics and a lower cold resistance than thermistor 48 so that thermistor 46' always transitions first (before thermistor 48') for first dropping a disproportionate share of the voltage. As hereinbefore described, if this voltage exceeds the knee voltage Vn of varistor 50', the latter shunts out thermistor 46' and protects the same until thermistor 48' heats and shares the voltage drop. Varistor 54', corresponding to 54 and 56 in FIG. 2, is in position for rapidly heating thermistor 48' as varistor 54' rises in temperature due to repetitive transients and the like, thereby protecting varistor 54' as thermistor 48' (as well as thermistor 46') transitions to its high resistance state.

Figure 6:
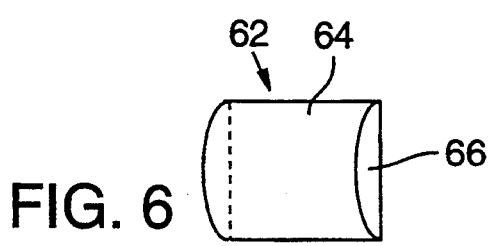
FIG. 6 is a perspective view of a portion of an improved protective device according to another embodiment.
Figure 7:
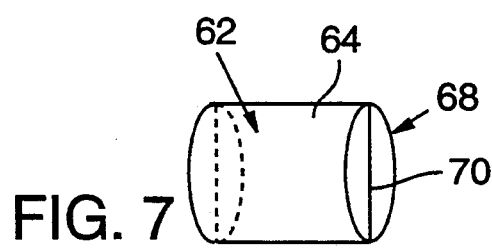
FIG. 7 is a perspective view of a two part device according to the last mentioned embodiment.
Figure 8:
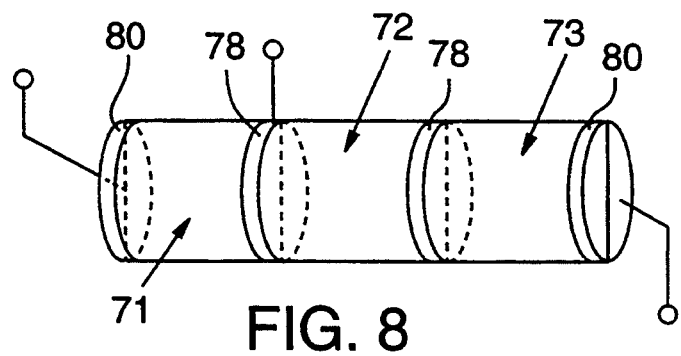
FIG. 8 is a perspective view of a multiple part protective device according to the last mentioned embodiment.

A further embodiment according to the present invention is illustrated in FIGS. 6–8. In this embodiment, instead of the thermistor and varistor slugs taking the form of solid cylinders, they comprise half-cylinder segments. Thus, a barium titanate thermistor slug 62 in FIG. 6 has a cylindrical outer surface 64 and a flat axial cross-sectional (back) face 66. As shown in FIG. 7, slug 62 is joined at it its flat axial face to the flat forward axial face of a similar sized and shaped slug 68 which may comprise a second thermistor or a varistor. Alternatively, elements 62 and 68 may both comprise varistors. The two elements 62 and 68 together comprise a cylindrical configuration having flat ends where the joinder between the two elements is illustrated as describing a diameter 70. Elements 62 and 68 are suitably bonded together at their axial flat surfaces by means of thermally conductive but electrically insulating adhesive, or they can simply be secured together.

Referring to FIG. 8, a plurality of thermistor-varistor, thermistor-thermistor, or varistor-varistor combinations 71, 72 and 73, each comprising half-cylindrical slugs, are joined end-to-end by intermediate electrically conductive metal spacers 78 which are soldered therebetween. The thermistors and varistors are selected to carry out the circuit of FIG. 2 within dashed lines 44. Similar electrically conductive discs 80 are disposed et opposite ends of the stack and provided with leads. If desired, spacers 78 and discs 80 may also be supplied with axially extending peripheral flanges for clamping the half-cylindrical elements. While an overall cylindrical shape as illustrated in FIG. 8 is of advantage for ease of handling, clearly other shapes, such as having a square or rectangular cross-section, could be substituted.

Thermistor means 46, 48 or thermistor means 46, 48, 52 in FIG. 2, for example, may be constructed as a single thermistor having a tap therealong.

Thus, according to embodiments of the present invention, an improved protective circuit for the input of an instrument such as a multimeter is provided which is suitable for protecting the instrument from unintended application at its input terminals of high voltages or high voltage transients. Shunt varistor means adapted to protect against high voltage transients are thermally coupled to serial thermistor means to avoid damage to the varistor means.

While preferred embodiments of the present invention have been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A protective circuit for an instrument comprising:
a serial protective path for connection in series with an instrument circuit and a parallel protective path for connection in shunt relation to said instrument circuit,
said serial protective path including plural thermistor means connected in series and a varistor disposed across at least one of said plural thermistor means,
said parallel protective path comprising at least one varistor coupled across said instrument circuit,
wherein thermistor means of said serial protective path and said at least one varistor of said parallel protective path are disposed in heat conducting relation enabling heat from the last mentioned varistor to raise the temperature of The last mentioned thermistor means causing the same to transition to a high resistance state for protecting said last mentioned varistor.

2. The protective circuit according to claim 1 wherein said plural thermistor means comprise positive temperature coefficient thermistors.

3. The protective circuit according to claim 1 wherein said varistor comprises a metal oxide varistor.

4. The protective circuit according to claim 1 wherein said varistor in said serial protective path is disposed across less than all the thermistor means of said plural thermistor means of said serial protective path so that remaining thermistor means thereof are able to drop substantial voltage.

5. The circuit according to claim 1 wherein said plural thermistor means are unitarily joined and provided with at least one tap therealong for serving as a varistor connection node.

6. The circuit according to claim 1 including enclosure means encapsulating said thermistor means and said at least one varistor in heat conducting relation.

7. The protective circuit according to claim 1 wherein said plural thermistor means comprise plural bulk thermistors joined in end-to-end heat conducting relation, the first mentioned varistor comprising a bulk varistor disposed in physical and electrical parallel relation with a bulk thermistor,
said at least one varistor of said parallel protective path comprising a bulk varistor joined in end-to-end heat conducting relation with one of said bulk thermistors.

8. The protective circuit according to claim 7 wherein said at least one varistor of said parallel protective path is joined to a said bulk thermistor other than the bulk thermistor having said first mentioned varistor disposed in parallel relation therewith.

9. A protective circuit for an instrument comprising:
a serial protective path for connection in series with an instrument circuit and a parallel protective path for connection in shunt relation to said instrument circuit,
said serial protective path including plural thermistor means connected in series and a varistor disposed across at least one of said plural thermistor means,
said parallel protective path comprising at least one varistor coupled across said instrument circuit,
wherein thermistor means of said serial protective path and at least one varistor of said parallel protective path are disposed in heat conducting relation enabling heat from the last mentioned varistor to raise the temperature of the last mentioned thermistor means causing the same to transition to a high resistance state for protecting said last mentioned varistor,
wherein said varistor in said serial protective path is disposed across less than all the thermistor means of said plural thermistor means of said serial protective path so that remaining thermistor means thereof are able to drop substantial voltage, and
wherein the cold resistance of said remaining thermistor means is less than the cold resistance of the thermistor means shunted by said varistor.

10. A protective circuit for an instrument comprising:
a serial protective path for connection in series with an instrument circuit and a parallel protective path for connection in shunt relation to said instrument circuit,
said serial protective path including plural thermistor means connected in series and a varistor disposed across at least one of said plural thermistor means,
said parallel protective path comprising at least one varistor coupled across said instrument circuit,
wherein thermistor means of said serial protective path and at least one varistor of said parallel protective path are disposed in heat conducting relation enabling heat from the last mentioned varistor to raise the temperature of the last mentioned thermistor means causing the same to transition to a high resistance state for protecting said last mentioned varistor,
wherein said varistor in said serial protective path is disposed across less than all the thermistor means of said plural thermistor means of said serial protective path so that remaining thermistor means thereof are able to drop substantial voltage, and
wherein said remaining thermistor means includes thermistor means coupled in parallel arrangement.

11. The protective circuit according to claim 10 wherein said at least one varistor is shunted by another varistor.

12. The circuit according to claim 11 wherein parallel thermistor means and varistors are joined to one another in two adjacent columns.

13. The circuit according to claim 11 wherein parallel thermistor means and comprise semi-cylindrical slugs joined to one another along axial cross sectional faces to complete substantially solid cylindrical configurations for shunt pairs of components, said shunt pairs being joined in heat conducting relation end-to-end.

14. A protective circuit for an instrument comprising:
a serial protective path for connection in series with an instrument circuit and a parallel protective path for connection in shunt relation to said instrument circuit,
said serial protective path including plural thermistor means connected in series and a varistor disposed across at least one of said plural thermistor means,
said parallel protective path comprising at least one varistor coupled across said instrument circuit,
wherein thermistor means of said serial protective path and at least one varistor of said parallel protective path are disposed in heat conducting relation enabling heat from the last mentioned varistor to raise the temperature of the last mentioned thermistor means causing the same to transition to a high resistance state for protecting said last mentioned varistor, and
wherein a said thermistor means other than said thermistor means shunted by the varistor is of greater net cross section than the thermistor means shunted by the varistor so that the non-shunted thermistor means normally has a smaller cold resistance in said circuit relative to said shunted thermistor means.

15. The circuit according to claim 14 wherein said at least one varistor of said parallel protective path is of a size comparable to the said thermistor means other than the one shunted by a varistor, and wherein said at least one varistor of said parallel protective path is joined in end-to-end relation to said thermistor means other than the one shunted by a varistor.

* * * * *